(12) United States Patent
Rädler et al.

(10) Patent No.: US 10,663,516 B2
(45) Date of Patent: *May 26, 2020

(54) METHOD AND DEVICE FOR TESTING A TAP CHANGER OF A TRANSFORMER

(71) Applicant: Omicron Electronics GmbH, Klaus (AT)

(72) Inventors: Michael Rädler, Klaus (AT); Boris Unterer, Feldkirch (AT)

(73) Assignee: Omicron Electronics GmbH, Klaus (AT)

(*) Notice: Subject to any disclaimer, the term of this patent is extended or adjusted under 35 U.S.C. 154(b) by 222 days.

This patent is subject to a terminal disclaimer.

(21) Appl. No.: 15/315,432

(22) PCT Filed: Jun. 29, 2015

(86) PCT No.: PCT/EP2015/064714
§ 371 (c)(1),
(2) Date: May 26, 2017

(87) PCT Pub. No.: WO2016/001151
PCT Pub. Date: Jan. 7, 2016

(65) Prior Publication Data
US 2017/0269160 A1    Sep. 21, 2017

(30) Foreign Application Priority Data
Jul. 2, 2014   (AT) .............................. A 50458/2014

(51) Int. Cl.
*G01R 31/327* (2006.01)
*G01R 31/62* (2020.01)
*H01H 9/00* (2006.01)

(52) U.S. Cl.
CPC ....... *G01R 31/327* (2013.01); *G01R 31/3271* (2013.01); *G01R 31/62* (2020.01); *H01H 2009/0061* (2013.01)

(58) Field of Classification Search
None
See application file for complete search history.

(56) References Cited

U.S. PATENT DOCUMENTS 5,804,954 A * 9/1998 Laplace, Jr. ............ G05F 1/147
                                                      323/256
7,859,232 B2 * 12/2010 Berggren .............. H02J 3/1814
                                                      323/216

(Continued)

FOREIGN PATENT DOCUMENTS

CN     1271170 A    10/2000
CN     1489697 A     4/2004

(Continued)

OTHER PUBLICATIONS

International Search Report of PCT/EP2015/064714 dated Oct. 22, 2015.

*Primary Examiner* — Nasima Monsur
(74) *Attorney, Agent, or Firm* — Seyfarth Shaw LLP; Brian Michaels

(57) ABSTRACT

The following steps are performed in order to test a tap changer (20) of a transformer (5; 6) which tap changer is designed to change a transmission ratio of the transformer (5; 6):
generating a test signal which is supplied to a winding (1-3; 10) of the transformer (5; 6) and to the tap changer (20).
Repeatedly actuating the tap changer (20) in order to change the transmission ratio with each actuation.
Determining a curve of an electrical measurement variable (I; $I_1$; $I_2$) of the transformer (5; 6) over time (t) respectively during the step of actuating the tap changer (20) depending on the test signal.
automatically illustrating the curves (41, 42) in a temporally-superimposed manner.

9 Claims, 8 Drawing Sheets

(56) References Cited

U.S. PATENT DOCUMENTS

Figure 1:
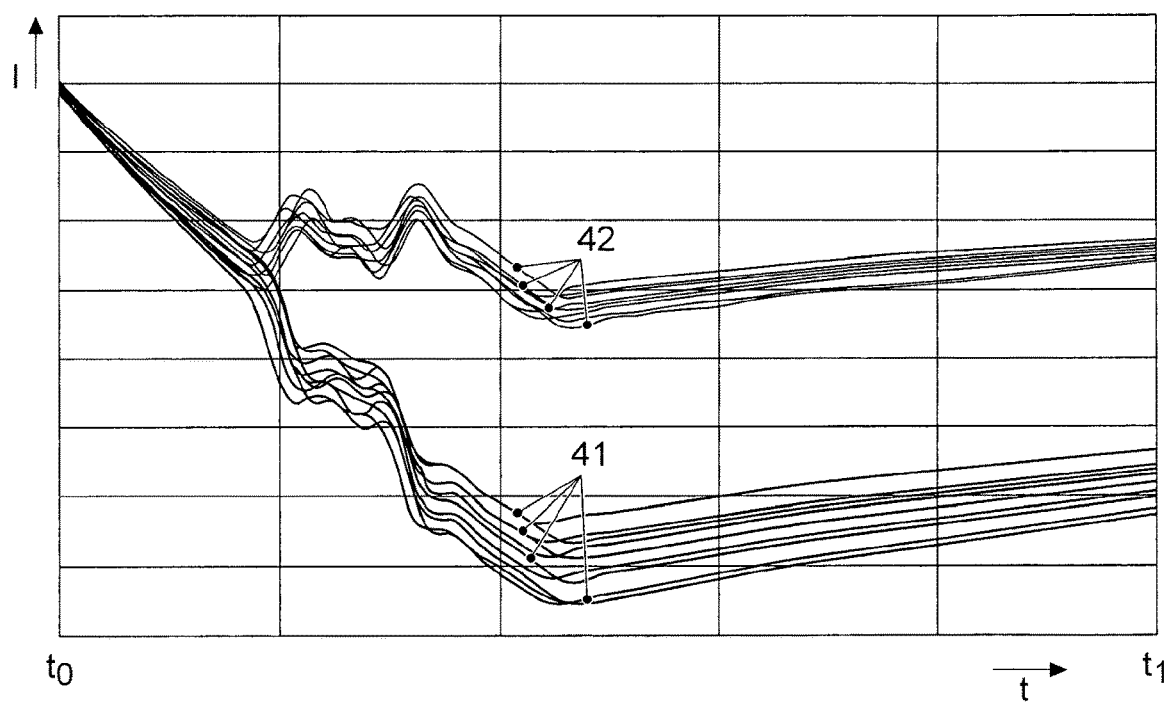

| | | | |
|---|---|---|---|
| 2004/0021449 A1* | 2/2004 | Stenestam | G01R 31/027 323/255 |
| 2008/0074073 A1* | 3/2008 | Genkawa | H02P 13/06 318/779 |
| 2008/0300807 A1* | 12/2008 | Marti | G01R 31/027 702/66 |
| 2010/0259277 A1 | 10/2010 | Johnson | |
| 2010/0263996 A1* | 10/2010 | Lunn | H01H 9/0016 200/11 TC |
| 2017/0123006 A1* | 5/2017 | Radler | G01R 31/027 |

FOREIGN PATENT DOCUMENTS

| | | |
|---|---|---|
| CN | 101251565 A | 8/2008 |
| CN | 101458308 B | 5/2011 |
| CN | 101107682 A | 1/2018 |
| EP | 0911842 A2 | 4/1999 |
| JP | 200208340 A | 7/2000 |
| JP | 2000208340 A | 7/2000 |
| KR | 10-2010-0115716 | 10/2010 |
| KR | 20130014977 A | 2/2013 |
| RU | 2290653 C2 | 12/2006 |
| RU | 2342673 C2 | 12/2008 |
| RU | 2516460 C2 | 5/2014 |
| WO | 2014035325 A1 | 3/2014 |

* cited by examiner

METHOD AND DEVICE FOR TESTING A TAP CHANGER OF A TRANSFORMER

The present invention relates to a method and a device for testing a tap changer of a transformer, in particular a power transformer.

Electrical power transformers, which are for example used for energy generation, energy transfer, energy distribution or for industrial applications and are designed for outputs greater than 1 MW, often comprise so-called tap changers in order to be able to adapt the transmission ratio of the respective transformer, for example to certain load conditions. Tap changers, which can also be switched during the operation of the transformer or under load, i.e. without interrupting the operation, are often also designated as on-load tap changers (OLTC). To this end, the winding of the transformer is designed as a so-called bank winding, wherein taps or tappings of this bank winding are guided to the tap changer which then switches over from one tap to another tap during the operation of the transformer in order to thereby change the transmission ratio of the transformer.

Since the windings of a transformer respectively constitute a large inductivity, a switching process between different transmission ratios cannot be implemented without problems since it is not possible to easily interrupt the current flow through a winding. A tap changer is thus designed such that the current can flow through the winding at any time. To this end, the tap changer often switches over the current, which flows through the winding, by means of resistors in order to thereby change the transmission ratio. The switching process must be performed quickly in order to avoid excessive heating of the resistors. Regular testing of each tap changer is recommended due to the complex and thus error-prone mechanics of the tap changers.

The object of the present invention is thus to improve the testing of a tap changer compared to the prior art.

According to the invention, this object is achieved by a method for testing a tap changer of a transformer according to claim 1 and by a device for testing a tap changer of a transformer according to claim 9. The dependent claims define preferred and advantageous embodiments of the present invention.

A method for testing a tap changer of a transformer is prepared within the context of the present invention. In this regard, the tap changer is designed to change (under load) a transmission ratio of the transformer. The method according to the invention comprises the following steps:

Generating a test signal which is supplied to a winding of the transformer and to the tap changer. The test signal may be, for example an electric current which flows through the winding and the tap changer arranged in series with the winding and is typically between a few amperes and approximately 100 amperes strong. The test signal may also be an electric voltage which is applied to the winding and/or to the tap changer such that an electric current results which flows through the series circuit from the winding and the tap changer.

Repeatedly actuating the tap changer, wherein the transmission ratio of the transformer is changed with each actuation of the tap changer. In other words, the transmission ratio of the transformer is repeatedly changed by respectively actuating the tap changer.

Determining a time curve of an electrical measurement variable of the transformer respectively during the actuation of the tap changer, wherein the electrical measurement variable changes depending on the test signal during the switching process (i.e. during the actuation of the tap changer). A current flowing through the winding and the tap changer connected in series and/or a voltage falling on the winding can be measured as the electrical measurement variables, wherein the current and/or the voltage changes by actuating the tap changer depending on the test signal generated. The time curve of the measurement variable can for example be determined by the measurement variable being continually determined during a predetermined time interval or at determined time periods within this time interval (e.g. 100 ms). In this regard, the time interval in particular begins directly before or shortly after the beginning of the actuation of the tap changer and ends after the transmission ratio has been changed by the tap changer or after the most abrupt changes of the measurement variable owing to the actuation of the tap changer or the switching process have abated.

In order to test the tap changer, the determined curves of the measurement variable are automatically illustrated in a temporally-superimposed manner. The illustration of the curves takes place in particular via a display or a screen. However, it is also possible to print out the curves on a printer for the illustration thereof or to illustrate them on other media. It is in particular understood by the temporally-superimposed illustration of the curves that a temporal end of each of the illustrated curves is plotted after all temporal beginnings of the illustrated curves.

By means of the temporally-superimposed illustration of the curves of the electrical measurement variable, the decision regarding whether or not the tap changer is operating correctly can be made in an improved and simpler manner than is the case according to the prior art. In this regard, the illustrated curves can also be evaluated by means of historical data (e.g. previously determined curves of the measurement variable).

The invention illustrates at least two time curves of the measurement variable in a temporally-superimposed manner. According to the invention, it is, however, possible to illustrate more than two (i.e. any number) of the time curves of the measurement variable in a temporally-superimposed manner.

The length of the time interval, during which the curve of the respective measurement variable is determined, can be selected such that the transformer reaches saturation after switching to the new transmission ratio in order to also determine the resistance of the winding by means of the determined measurement variable.

According to a preferred embodiment according to the invention, the transformer may be a multi-phase transformer (e.g. a three-phase alternating current transformer). In the case of a multi-phase transformer, a separate tap changer is present for each phase of the transformer which is designed to change (under load) a transmission ratio of the transformer. In order to test the tap changers, a test signal is respectively generated for each phase of the transformer simultaneously. This test signal is, for each phase, supplied to a winding of the transformer assigned to the respective phase and to the tap changer assigned to this winding. If the test signals are respectively a current, a current is for example generated for each phase of the transformer simultaneously which flows through the winding assigned to the respective phase and through the tap changer assigned to the winding, said tap changer being arranged in series with the respective winding. If the test signals are respectively a voltage, a voltage is, for example for each phase of the transformer, simultaneously applied to the winding assigned to this phase in order to thereby generate a current through this winding and the assigned tap changer. The tap changers are actuated repeatedly, wherein the transmission ratio is changed with each actuation. In this regard, the tap changers should all be actuated simultaneously. During the actuation of the tap changers, a time curve of the electrical measurement variable is determined for each tap changer, said electrical measurement variable changes depending on the test signal during the switching process. This measurement variable may be an electric current which flows through one of the windings and the tap changer assigned to this winding and arranged in series with this winding. However, it is also possible for the measurement variable to be an electric voltage which falls on one of the windings. The curves of the respective tap changer are automatically illustrated in a temporally-superimposed manner. In this regard, curves of the measurement variable of different phases and/or the same phase can also be illustrated in a temporally-superimposed manner.

Advantageously, jumps in amplitude that occur or temporal shifts for the different phases can be compared in particular by means of the temporally-superimposed illustration of curves of the measurement variable of different phases in order to decide by means of this comparison whether the tap changers of the multi-phase transformer are operating correctly.

The test signals can be generated for each phase such that the test signals comprise the same value, whereby the recorded curves are directly comparable with each other.

In the case of a three-phase transformer with a star point connection, which preferably comprises a Y or a Z winding, all three-phases can be tested simultaneously. To this end, a current can be impressed as the test signal, which flows, in the case of two phases, into the winding (i.e. the current is impressed on the winding at the end facing away from the star point) and flows, in the case of one phase, from the winding (i.e. the current is removed from the winding at the end facing away from the star point). If the three currents are identical in terms of value, a fourth current additionally flow out (i.e. it is removed from the winding at the end facing away from the star point).

Both in the case of a multi-phase transformer and in the case of a single-phase transformer, the test signal can be a direct current signal, i.e. an electric direct current.

In the case of the temporally-superimposed illustration of the curves of the respectively determined electrical measurement variable, there is, on the one hand, the possibility to plot curves as congruently as possible such that for example two identical curves are illustrated precisely over each other. Another possibility according to the invention is to plot the curves (slightly) offset such that for example two identical curves can be distinguished. In this regard, the curves can be illustrated offset either in the direction of the time axis and/or perpendicular to the time axis.

For the temporally-superimposed illustration of the curves, time periods of the curves corresponding to each other are in particular illustrated in a temporally-superimposed manner. As was already previously described, the respectively corresponding time period or the respectively corresponding time interval of the respective curve can begin shortly before or shortly after the respective actuation of the tap changer and can end after the end of the performance of the switching to a new transmission ratio. The respective time period of the respective curve can for example be 100 ms of the respective switching process.

As is similarly at least partially previously described, the electrical measurement variable can comprise one or a plurality of the following electrical measurement variables:
the electric current which flows through the respective winding and the tap changer assigned to this winding.
the electric voltage which falls on the respective winding.
an electrical resistance value which is calculated depending on the voltage and the current (in particular as a quotient from the voltage and the current). This resistance value may be an ohmic resistance value or direct current resistance value or an impedance value or alternating current resistance.

According to the invention, the measurement variable may also be another electrical variable, such as for example the electrical output or the electric energy which is received by the respective winding or delivered by the same.

In the context of the present invention, a device for testing a tap changer of a transformer is also prepared. In this regard, the tap changer is designed to change (under load or during operation) a transmission ratio of the transformer. The device comprises test signal generation means, measuring means and control means. By means of the test signal generation means and the control means, the device generates a test signal which is supplied to a winding of the transformer and to the tap changer. By means of the measuring means, the device is capable of determining a time curve of an electrical measurement variable of the transformer respectively during an actuation of the tap changer depending on the test signal. The control means are designed to illustrate the curves in a temporally-superimposed manner.

The advantages of the device according to the invention correspond substantially to the advantages of the method according to the invention which were previously explained in detail such that they will not be repeated here.

According to an embodiment according to the invention, the transformer may be a multi-phase transformer, wherein a separate tap changer is present for each phase of the transformer, said tap changer is designed to change (under load) a transmission ratio of the transformer. According to this embodiment according to the invention, the device is thus designed to test a tap changer or the tap changers of a multi-phase transformer. Furthermore, the device is designed to simultaneously generate respectively one test signal for each phase of the transformer by means of the test signal generation means and to supply these test signals respectively (i.e. respectively one of these test signals) to a winding of the transformer assigned to the respective phase or to the tap changer assigned to this winding. The device is capable of determining a time curve of an electrical measurement variable of the transformer respectively during an actuation of the tap changer by means of the measuring means for each tap changer. The device according to the invention illustrates, for each tap changer, the curves of the respective tap changer in a temporally-superimposed manner by means of the control means.

The advantages of this embodiment according to the invention correspond substantially to the advantages of the corresponding embodiment of the method according to the invention which were previously explained in detail such that they will not be repeated here.

The device in particular comprises a display and is designed such that the device illustrates the curves on this display by means of the control means.

The interpretation of the determined measurement variables is simplified in comparison to the prior art by means of the graphic illustration of the temporally-superimposed curves of the electrical measurement variable for the respective tap changer. As a result, the testing of the tap changer is ultimately also simplified.

The present invention can in particular be used for testing tap changers of power transformers. The present invention is of course not limited to this preferred field of application since the invention can for example also be used to test tap changers of transformers which are not considered power transformers.

The invention is described in detail below by means of preferred embodiments according to the invention with reference to the figures.

A plurality of time curves of an electric current is illustrated in FIG. 1 in the case of actuating a tap changer of a transformer according to the invention.

Figure 2:
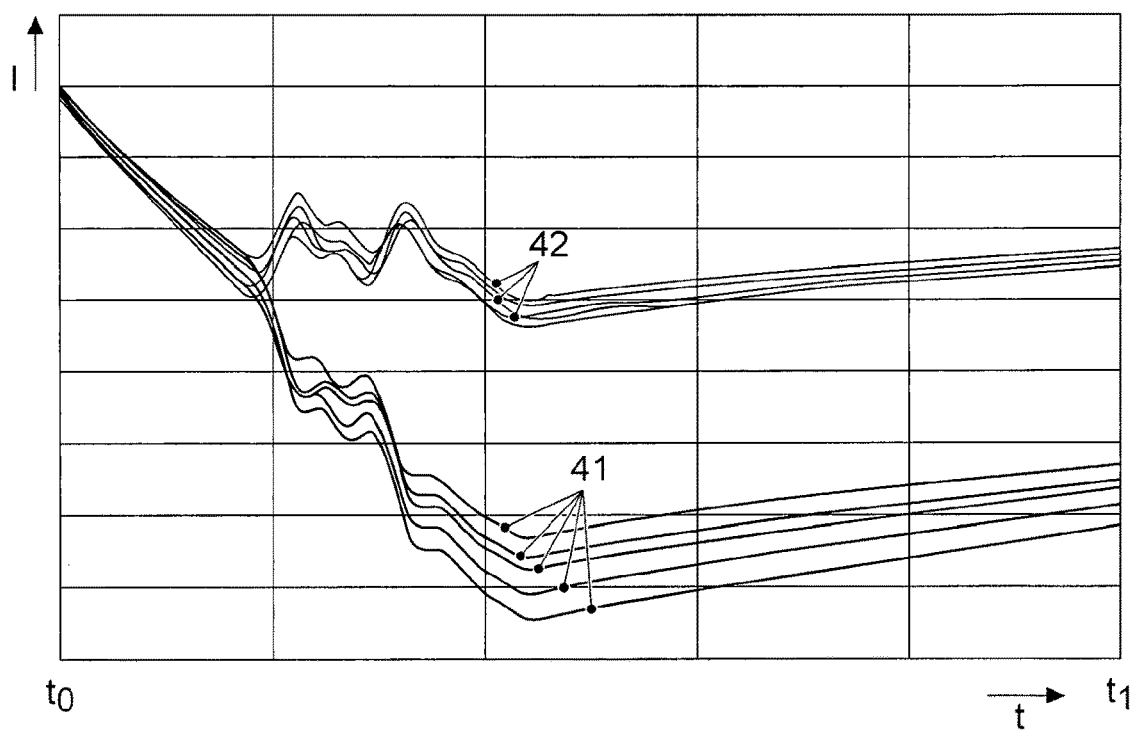
Figure 3:
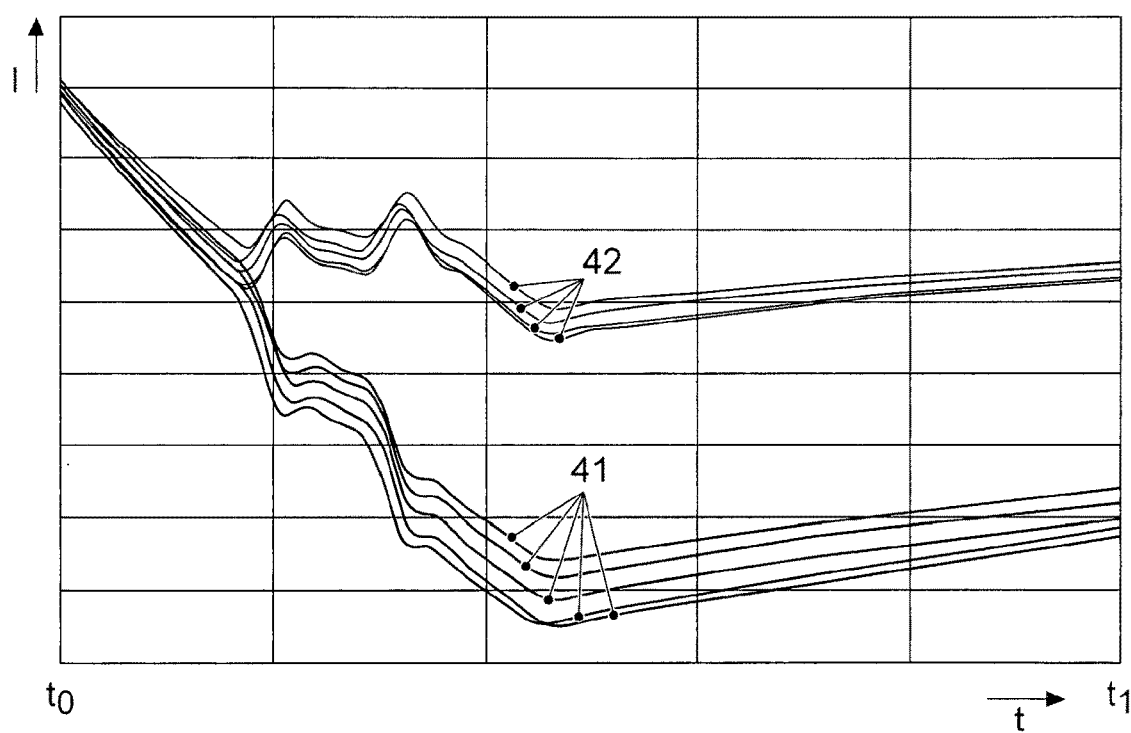
Figure 4:
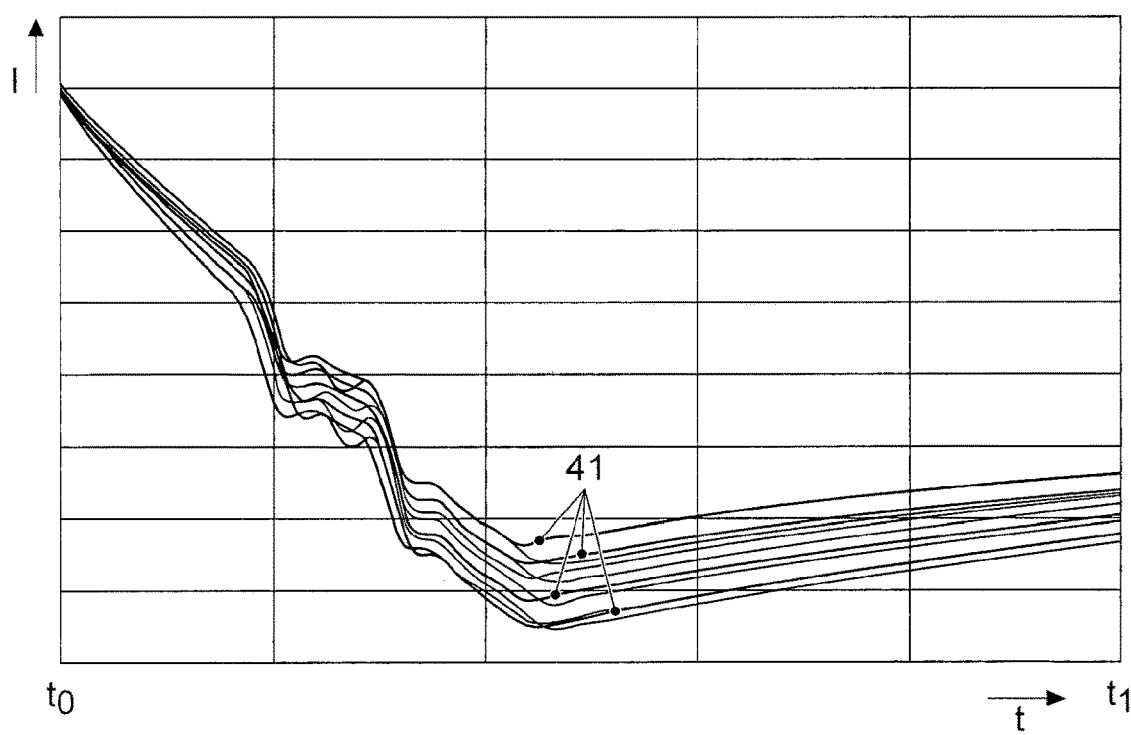

Only certain time curves of those illustrated in FIG. 1 are illustrated in FIGS. 2 to 4.

Figure 5:
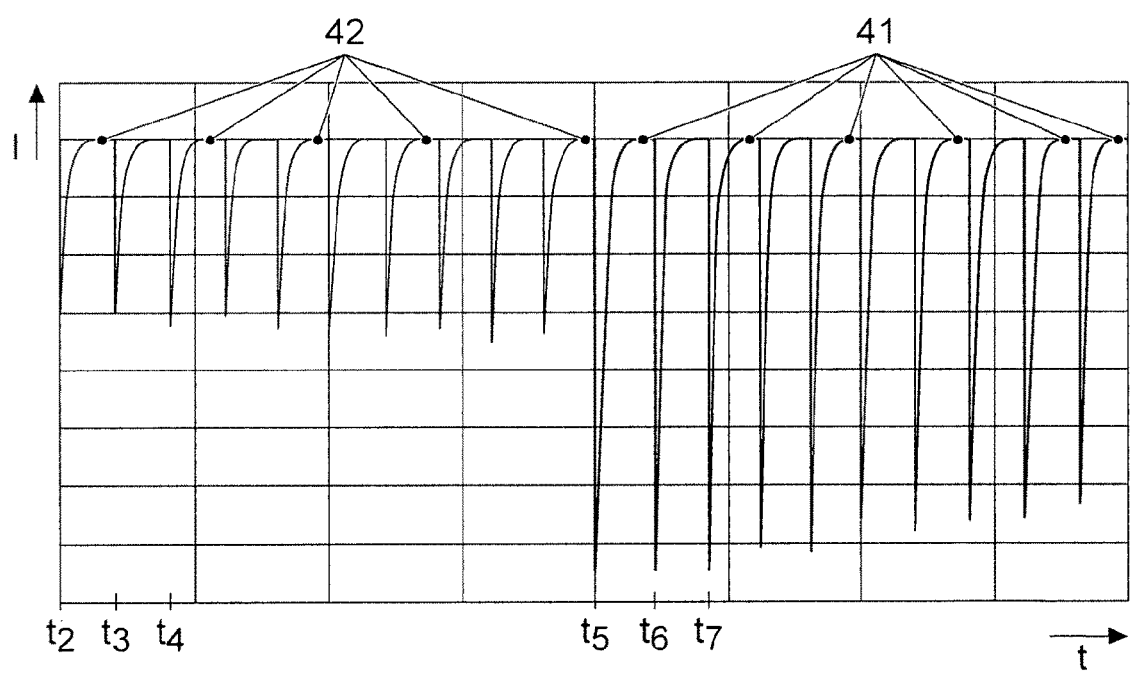

The time curves of an electric current in the case of actuating a tap changer of a transformer are not illustrated in a temporally-superimposed manner in FIG. 5, but rather they are illustrated chronologically.

Figure 6:
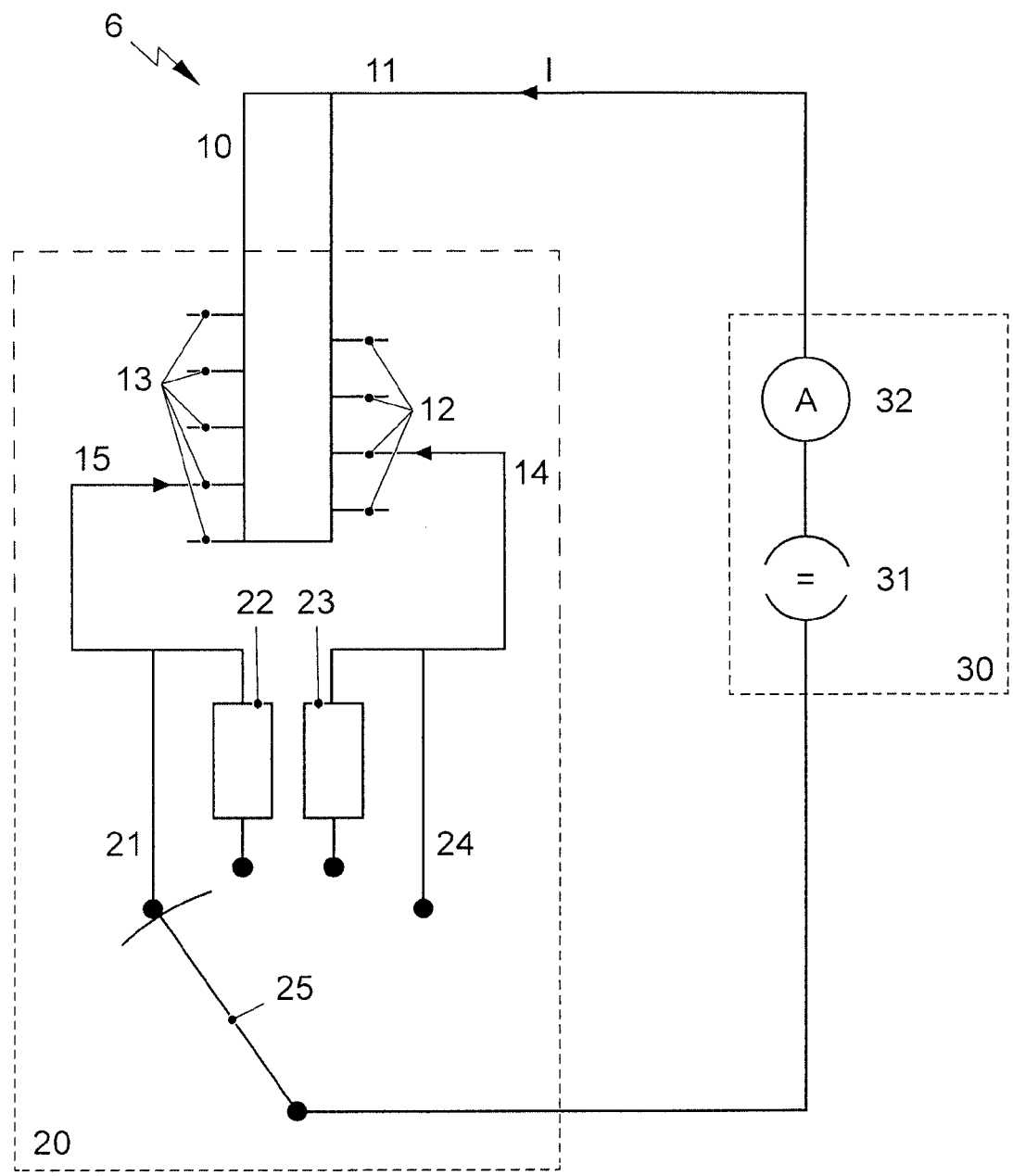

A transformer with tap changer is illustrated together with a device according to the invention in FIG. 6.

Figure 7:
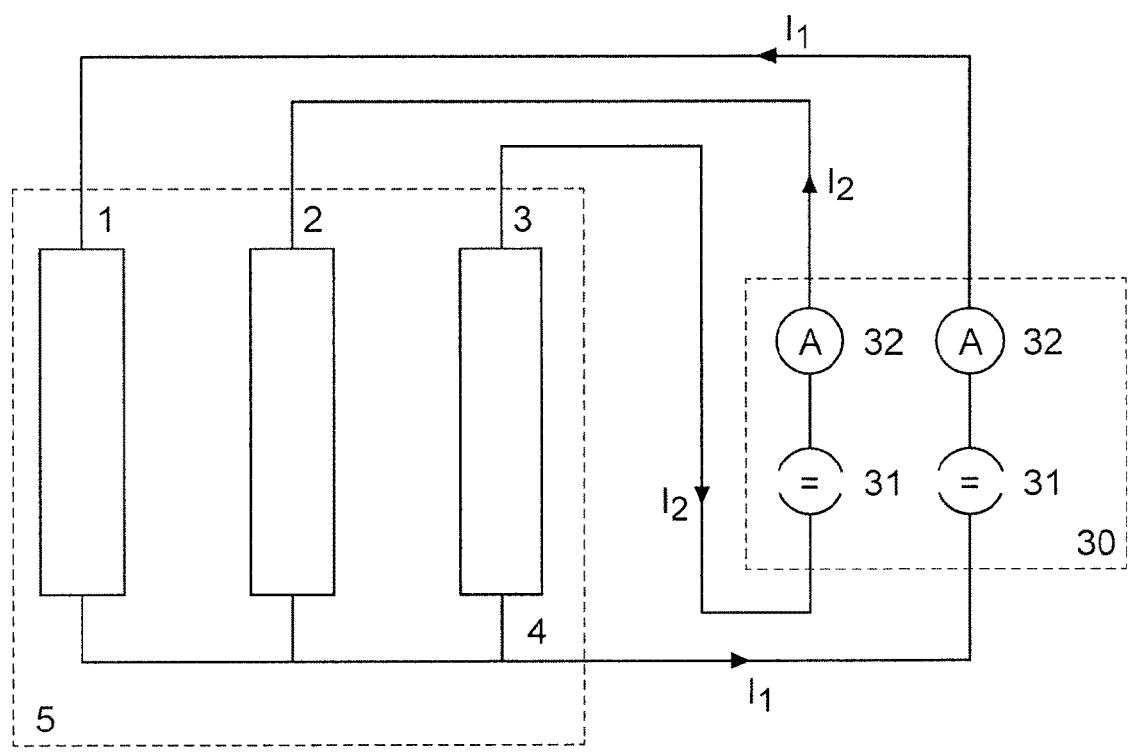

A multi-phase transformer is illustrated together with a device according to the invention in FIG. 7.

Figure 8:
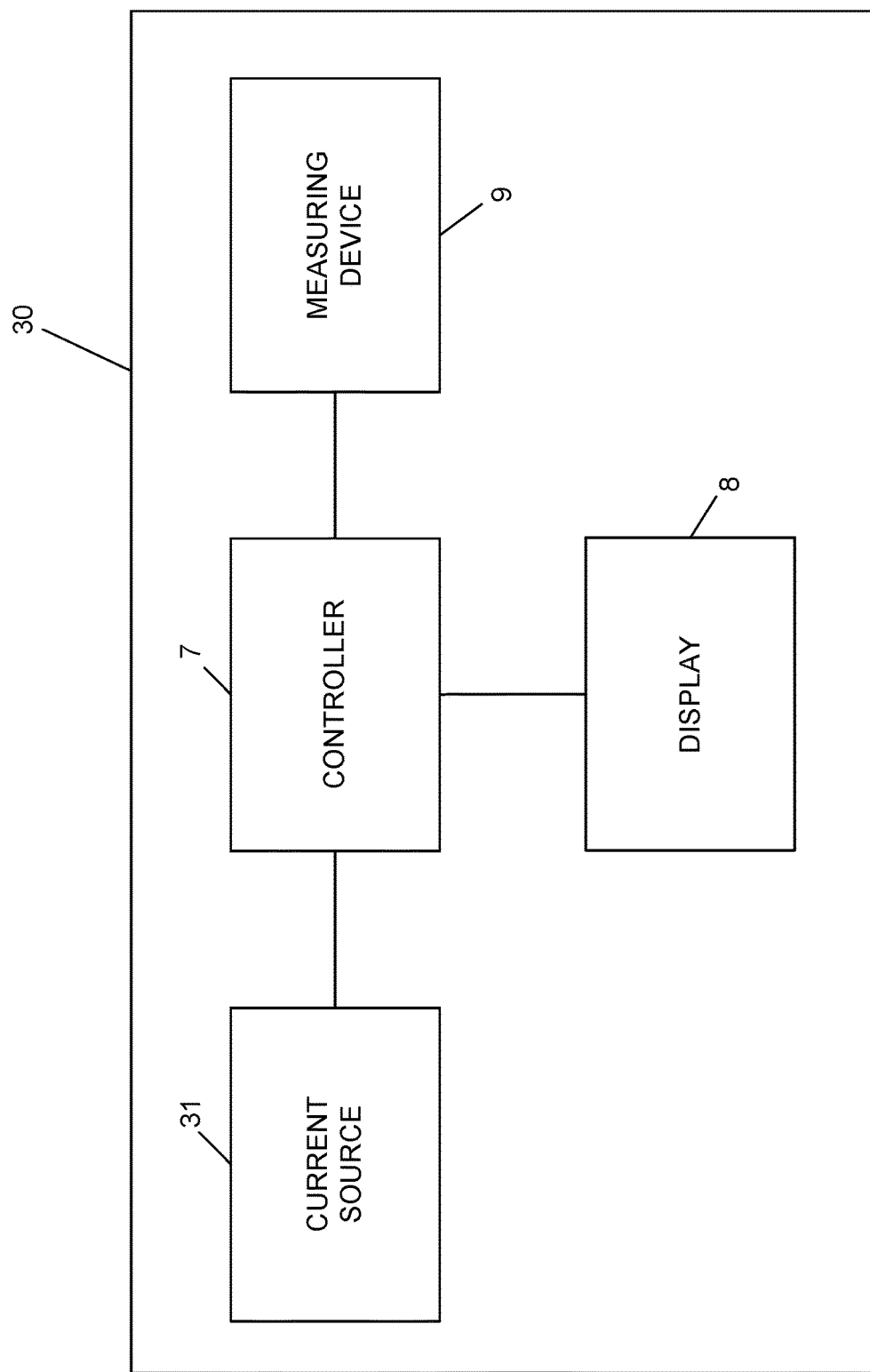

A device according to the invention is schematically illustrated in FIG. 8.

Although one electric current is respectively illustrated in the following figures by way of example both as a test signal and as a measurement variable, it should be explicitly noted that according to the invention a voltage can also be applied as the test signal and/or that a voltage, an electrical resistance, an impedance, an output, energy, etc. can also be used or determined as a measurement variable.

A plurality of time curves 41, 42 of an electric current are illustrated in a temporally-superimposed manner according to the invention in FIG. 1, wherein each of the curves 41, 42 is determined in the case of the actuation of a tap changer of a transformer. The electric current, the curve of which is determined, flows through the winding and the tap changer arranged in series with the winding. A time period is respectively illustrated for each of the curves which begins at a first time point $t_0$ and ends at a second time point $t_1$. In this regard, the first time point $t_0$ comes shortly after the beginning of the actuation of the tap changer and the second time point $t_1$ comes after the end of the switching process of the tap changer.

In the present case, the winding comprises eleven taps or tappings between which the tap changer can be switched, as is explained more precisely in FIG. 6. The curves labelled with the reference numeral 41 respectively show one of ten current curves which are determined when the tap changer switches upwards, whereby the number of the effective coils of the winding is reduced. In a similar manner, the curves labelled with the reference numeral 42 respectively show one of ten current curves which are determined when the tap changer switches downwards, whereby the number of the effective coils of the winding is increased.

As illustrated in FIG. 6, there are left-hand or odd taps 13 and right-hand or even taps 12 of the winding 10. Only the current curves 41, 42 in the case of even switching processes are illustrated in FIG. 2 by eliminating the current curves in the case of odd switching processes by means of filters. An even switching process is then present when switching takes place to an even or right-hand tap 12. In this regard, switching can take place to an even or right-hand tap 12 both in the case of downwards switching and in the case of upwards switching. In other words, the current curves labelled with the reference numeral 41 in FIG. 2 show five even switching processes in the case of downwards switching, while the current curves labelled with the reference numeral 42 in FIG. 2 show five even switching processes in the case of upwards switching.

In contrast, only the current curves 41, 42 in the case of odd switching processes are illustrated in FIG. 3 by eliminating the current curves in the case of even switching processes by means of filters. An odd switching process is then present when switching takes place to an odd or left-hand tap 13 (see FIG. 6). Like in the case of even switching processes, in the case of odd switching processes, switching can take place to an odd or left-hand tap 13 both in the case of downwards switching and in the case of upwards switching. In other words, the current curves labelled with the reference numeral 41 in FIG. 3 show five odd switching processes in the case of downwards switching, while the current curves labelled with the reference numeral 42 in FIG. 3 show five odd switching processes in the case of upwards switching.

Only the ten current curves 41 in the case of even switching processes are illustrated in FIG. 4 such that the ten current curves 42 in the case of odd switching processes (see FIG. 1) are not illustrated since they have been filtered out.

The 20 current curves 41, 42 from FIG. 1 are illustrated in FIG. 5 chronologically side by side. In this connection, a time point (e.g. $t_3$ or $t_6$), at which a current curve 41, 42 ends, corresponds to a time point at which a current curve illustrated adjacent thereto begins. In other words, the current curves illustrated in FIG. 5 are not illustrated in a temporally-superimposed manner.

A transformer 6 with a tap changer 20 and a device 30 according to the invention for testing the tap changer 20 are illustrated in FIG. 6.

The transformer 6 comprises a winding 10 which has a plurality of taps or tappings 12, 13. The tap changer 20 comprises two tap selectors 14, 15. In this regard, the one tap selector 14 is connected to one of the right-hand or even taps 12 and the other tap selector 15 is connected to one of the left-hand or odd taps 13. Furthermore, the tap changer 20 comprises a first connection 21 and a first resistor 22 which are assigned to the tap selector 15 as well as a second connection 24 and a second resistor 23 which are assigned to the tap selector 14. In the case of the condition illustrated in FIG. 6, a current I flows at connection 11 into the winding 10 and flows out from the winding 10 at the tap 13 which is in contact with the tap selector 15.

In order to now change the transmission ratio of the transformer 6, a switch 25 of the tap changer 20 is switched from connection 21 to connection 24. The switch 25 here contacts in a first step both the first connection 21 and the first resistor 22 such that the current I flows through the first resistor 22 if the switch 25 loses the contact to the first connection 21 in the second step. In the third step, the switch 25 contacts both the first resistor 22 and the second resistor 23 such that the current I flows both via the first resistor 22 and via the second resistor 23 and thus both via the tap selector 15 and the corresponding tap 13 and via the tap selector 14 and the corresponding taps 12. If the switch 25 is switched further, the switch 25 loses the contact with the first resistor 22 in the fourth step such that the current I flows in the fourth step only via the second resistor 23 and the tap selector 14 and the corresponding tap 12. If the switch 25 is switched further, the switch 25 contacts the second connection 24 in the fifth step such that the second resistor 23 is virtually short-circuited. The current I flows via the second connection 24 as well as the tap selector 14 and the associated tap 12 such that the transmission ratio of the transformer 6 changes correspondingly. If the switch 25 is switched further, the switch 25 loses the contact to the second resistor 23 in the sixth and final step, whereby the switching process or the actuation of the tap changer 20 for changing the transmission ratio of the transformer 6 has finally ended.

As soon as the tap selector 15 is switched in a currentless manner (i.e. with the fourth step), the tap selector can be connected to another left-hand or odd tap 13. In order to once again change the transmission ratio of the transformer 6, the switch 25 is switched in a similar manner as previously described from the second connection 24 to the first connection 21.

In order to test the tap changer 20, the device 30 according to the invention is present which has a current source 31 and an ammeter 32. The current I is generated by means of the current source 31 which flows through the winding 10 and the tap changer 20 arranged in series with the winding 10. A time curve of the current I flowing through the winding 10 and the tap changer 20 is in particular determined during the switching of the tap changer 20 with a corresponding measuring device 9 (see FIG. 8) of the device 30 according to the invention and is illustrated in a temporally-superimposed manner together with other current curves which have been determined during other switching processes of the tap changer 20.

A multi-phase transformer 5 is illustrated in FIG. 7 which has three phases with respectively one winding 1-3 in a Y-interconnection. In this regard, each phase or winding 1-3 has a tap changer 20 (not illustrated in FIG. 7) in order to change the transmission ratio of the transformer 5 in the same manner as was previously described with regard to FIG. 6.

In order to test the tap changers, the device 30 according to the invention generates a first direct current $I_1$ which is supplied to the end of the first winding 1 facing away from the star point 4 and a second direct current $I_2$ which is, on the one hand, taken away from the end of the third winding 3 facing away from the star point 4 and, on the other hand, is supplied to the end of the second winding 2 facing away from the star point 4. It can be discerned that the first direct current $I_1$ also flows away from the star point 4 to the device 30. In other words, the test signals or direct currents $I_1$, $I_2$, which are supplied to each winding 1-3, comprise the same value.

The time curves of the currents through the three windings 1-3 are determined, while the tap changers are repeatedly switched in order to change the transmission ratio of the multi-phase transformer 5. A plurality of determined current curves are illustrated in a temporally-superimposed manner for each tap changer in order to test the correct operation of the tap changers.

A further embodiment of the device 30 according to the invention is schematically illustrated in FIG. 8. In addition to a current source 31 which corresponds to the test signal generation means, the device 30 comprises, a controller 7, a display 8 and a measuring means 9 by means of which a time curve 41, 42 of the electrical measurement variable can be determined. The determined time curves 41, 42 are illustrated on the display 8 in a temporally-superimposed manner.

LIST OF REFERENCE NUMERALS 1-3 Winding
4 Star point
5 Three-phase alternating current transformer
6 Transformer
7 Controller
8 Display
9 Measuring device
10 Winding
12, 13 Tap or tapping
14, 15 Tap selectors
20 Tap changer
11, 21, 24 Connection
22, 23 Resistor
25 Switch
30 Device
31 Current source
32 Ammeter
41 Current curve in the case of downwards switching
42 Current curve in the case of upwards switching
I, $I_1$, $I_2$ Direct current
t Time
$t_x$ Time point

The invention claimed is:

1. Method for testing a complete tap changer of a transformer having a winding comprising a plurality of taps between which the tap changer can be switched,
   wherein the tap changer is designed to change a transmission ratio of the transformer,
   wherein the method comprises the following steps:
   generating a test signal which is supplied to the winding of the transformer and to the tap changer,
   repeatedly actuating the tap changer to cause the tap changer to switch between each of the plurality of taps in order to change the transmission ratio with each actuation for testing the complete tap changer,
   for each switch of the tap changer, determining a curve of an electrical measurement variable of the transformer over time during the step of actuating the tap changer depending on the test signal, and
   automatically illustrating the curves of the electrical measurement variable determined during the repeatedly actuating of the tap changer in a temporally-superimposed manner, wherein the curves of the electrical measurement variable are at least one of different phases and a same phase,
   wherein the transformer is a multi-phase transformer,
   a separate tap changer is present for each phase of the transformer which is designed to change a transmission ratio of the transformer,
   respectively one test signal is generated simultaneously for each phase of the transformer which is supplied to a winding of the transformer assigned to the respective phase and to the tap changer assigned to the winding,
   the tap changers are actuated repeatedly in order to change the transmission ratio with each actuation,
   a curve of an electrical measurement variable of the transformer is determined over time respectively during the step of actuating the tap changers for each tap changer depending on the test signal, and
   the curves of the respective tap changer are automatically illustrated in a temporally-superimposed manner.

2. Method according to claim 1, wherein the test signals for each phase are generated identically in terms of value.

3. Method according to claim 1, wherein the test signal is a direct current signal.

4. Method according to claim 1, wherein the curves are plotted as congruently as possible.

5. Method according to claim 1, wherein the curves are plotted in an offset manner.

6. Method according to claim 1, wherein time periods of the curves corresponding to each other are illustrated in a temporally-superimposed manner.

7. Method according to claim 1, wherein the electrical measurement variable comprises one of:
   a current which flows through the winding and the tap changer,
   a voltage drop at the winding, or
   an electrical resistance value which can be calculated depending on the voltage and the current.

8. Apparatus for testing a complete tap changer of a transformer having a winding comprising a plurality of taps between which the tap changer can be switched,
   wherein the tap changer is designed to change a transmission ratio of the transformer,
   wherein the apparatus comprises a test signal generation device, a measuring device and a control device,
   wherein the apparatus is designed to supply a test signal to the winding of the transformer and to the tap changer by means of the test signal generation device and the control device,
   wherein the apparatus is designed to repeatedly actuate the tap changer to cause the tap changer to switch between each of the plurality of taps in order to change the transmission ratio with each actuation and test completely the tap changer,
   wherein the apparatus is designed to determine a curve of an electrical measurement variable of the transformer by the measuring device over time respectively during repeated switches of the tap changer between each of the plurality of taps depending on the test signal, and
   wherein the control device is designed to illustrate the curves of the electrical measurement variable determined during the repeated switches of the tap changer in a temporally-superimposed manner, wherein the curves of the electrical measurement variable are at least one of different phases and a same phase,
   wherein the transformer is a multi-phase transformer,
   wherein a separate tap changer is present for each phase of the transformer which is designed to change a transmission ratio of the transformer,
   wherein the apparatus is designed to simultaneously generate respectively one test signal for each phase of the transformer by means of the test signal generation device and to supply said test signal to a winding of the transformer assigned to the respective phase and to the tap changer assigned to the winding,
   wherein the apparatus is designed to determine a curve of an electrical measurement variable of the transformer by the measuring device over time respectively during an actuation of the tap changers for each tap changer depending on the test signal, and
   wherein the control device is designed to illustrate the curves of the respective tap changer for each tap changer in a temporally-superimposed manner.

9. Apparatus according to claim 8, wherein the apparatus comprises a display,
   wherein the apparatus is designed such that the control device illustrates the curves on the display.

* * * * *